United States Patent

Tate

(10) Patent No.: US 9,258,895 B1
(45) Date of Patent: Feb. 9, 2016

(54) ELECTRONIC DEVICE SOCKET WITH AN INTEGRATED DECOUPLING CAPACITOR AND HEAT SINK

(71) Applicant: John O. Tate, Lincoln, RI (US)

(72) Inventor: John O. Tate, Lincoln, RI (US)

( * ) Notice: Subject to any disclaimer, the term of this patent is extended or adjusted under 35 U.S.C. 154(b) by 0 days.

(21) Appl. No.: 14/567,977

(22) Filed: Dec. 11, 2014

(51) Int. Cl.
  H05K 7/20 (2006.01)
  H05K 1/11 (2006.01)
  H05K 1/02 (2006.01)
  H01R 13/66 (2006.01)
  G06F 1/20 (2006.01)
  H01R 12/00 (2006.01)

(52) U.S. Cl.
  CPC ............ H05K 1/115 (2013.01); H01R 13/6625 (2013.01); H05K 1/021 (2013.01); H05K 2201/09227 (2013.01); H05K 2201/09618 (2013.01); H05K 2201/10015 (2013.01)

(58) Field of Classification Search
  CPC . H05K 7/20; H05K 7/20418; H05K 7/20436; H05K 1/11; H01R 12/00; H01L 23/642; G06F 1/20; G06F 1/26; H04L 65/607; H04L 65/80
  USPC ............... 361/679.46, 679.54, 704–710, 715, 361/718–723, 760–764, 784, 785, 767, 361/306.2, 321.3, 734, 790, 773; 439/69, 439/83, 70, 71, 72, 485, 487, 525, 66, 863; 257/691, 697, 706–723, 698; 174/15.1, 174/16.3, 252, 520; 165/80.2, 80.3, 104.33, 165/185
  See application file for complete search history.

(56) References Cited

U.S. PATENT DOCUMENTS

| | | | | | |
|---|---|---|---|---|---|
| 3,880,493 | A | * | 4/1975 | Lockhart, Jr. | ......... H01L 23/642 257/532 |
| 3,917,375 | A | * | 11/1975 | Johnson | ............... H05K 7/1038 439/487 |
| 4,356,532 | A | * | 10/1982 | Donaher | ................ H05K 1/141 174/541 |
| 4,577,258 | A | * | 3/1986 | Jodoin | ..................... H01G 2/06 361/306.2 |
| 4,617,708 | A | * | 10/1986 | Fanning | ............ H01L 23/49589 257/E23.057 |
| 4,636,918 | A | * | 1/1987 | Jodoin | ..................... H01G 2/06 257/916 |
| 4,645,943 | A | * | 2/1987 | Smith, Jr. | .................. G06F 1/30 307/150 |
| 4,667,267 | A | * | 5/1987 | Hernandez | ............... H01G 2/12 361/306.2 |
| 4,779,164 | A | | 10/1988 | Menzies | |
| 4,882,656 | A | * | 11/1989 | Menzies, Jr. | ............ H01G 2/065 361/306.2 |

(Continued)

Primary Examiner — Michail V Datskovskiy
(74) Attorney, Agent, or Firm — Barlow, Josephs & Holmes, Ltd.

(57) ABSTRACT

An electronic device socket includes an insulating circuit board having a plurality of electrical terminals mounted therein, a decoupling capacitor mounted on the circuit board and a heat sink body. Each electrical terminal has a female upper end which can receive a lead of an electronic device, and a male lower end which can be received in a printed circuit board or another socket. The decoupling capacitor is electrically connected between the designated voltage and ground terminals. The heat conducting body has an upper surface configured to receive an electronic device in thermally conductive relation, and a lower surface having a recessed cavity configured to receive the circuit board. The heat conducting body has vias corresponding to the electrical terminals. The circuit board is received within the recessed cavity wherein the female upper ends of the electrical terminals are aligned with vias and receive the leads of an electronic device.

6 Claims, 3 Drawing Sheets

(56) References Cited

U.S. PATENT DOCUMENTS

| | | | | |
|---|---|---|---|---|
| 5,683,256 A | * | 11/1997 | Werther | H01R 13/6625 439/225 |
| 6,176,709 B1 | * | 1/2001 | Sonobe | H01R 12/57 439/69 |
| 6,515,870 B1 | * | 2/2003 | Skinner | H01L 23/552 257/691 |
| 7,209,366 B2 | * | 4/2007 | Prokofiev | H01L 23/50 174/520 |
| 8,721,359 B1 | * | 5/2014 | Tate | H01R 12/58 439/487 |
| 2006/0012026 A1 | * | 1/2006 | Kang | H01L 23/13 257/697 |

* cited by examiner

ELECTRONIC DEVICE SOCKET WITH AN INTEGRATED DECOUPLING CAPACITOR AND HEAT SINK

BACKGROUND OF THE DISCLOSURE

The instant invention relates to an electronic device socket for electronic devices such as dual-inline-package (DIP) devices or a round package device, including an integrated heat sink which sits beneath the device, and further including a decoupling capacitor to reduce circuit voltage noise.

SUMMARY OF THE INVENTION

An electronic device socket includes an insulating circuit board having a plurality of electrical terminals mounted therein, a decoupling capacitor mounted on the circuit board, and a heat sink body.

Each electrical terminal has a female upper end which can receive the lead of an electronic device, and a male lower end which, in turn, can be connected to or received in a printed circuit board (PCB) or another socket.

The decoupling capacitor is electrically connected between a predetermined pair of the electrical terminals corresponding to the voltage and ground terminals of the electronic device, or the ground can be the heat sink body.

The heat sink body has an upper surface configured to receive an electronic device in thermally conductive relation, and a lower surface having a recessed cavity configured to receive the circuit board in interfitting mated relation. The heat sink body has vias corresponding to the electrical terminals and extending from said upper surface through to the recessed cavity.

The circuit board is received in mated relation within the recessed cavity wherein the female upper ends of said electrical terminals are aligned with the vias and receive the leads of an electronic device seated on the upper surface of the heat sink body. The male ends of the electrical terminals extend below the lower surface of the heat sink body for connection with a PCB or other socket. In another embodiment, the lower male ends of the terminals are shortened for a surface mount configuration on a PCB.

Accordingly, among the objects of the instant invention are: the provision of an electronic device socket including an integrated heat sink and an integrated decoupling capacitor.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE PREFERRED EMBODIMENT

Figure 1:
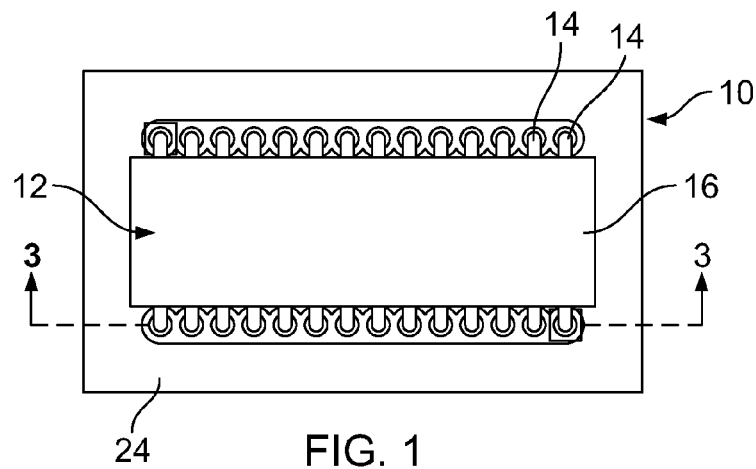
FIG. 1 is a plan view of a DIP circuit device installed in the device socket of the present invention.

Referring now to the drawings, the electronic device socket of the instant invention is illustrated and generally indicated at 10 in FIGS. 1-10. As will hereinafter be more fully described, the device socket 10 is intended to be used with an electronic device package generally indicated at 12 having a plurality of leads 14 extending from a package body 16. The device 12, as illustrated, comprises a 28 pin, dual-inline package (DIP) with the leads of the device arranged in a 2×14 array. However, the scope of the invention is not to be limited by the specific device shown or limited to any particular configuration of leads, or shape, i.e. square, rectangular or round with leads protruding therefrom.

The instant electronic device socket 10 includes an insulating circuit board generally indicated at 18 having a plurality of electrical terminals 20 mounted therein, a decoupling capacitor 22 mounted on the circuit board 18, and a heat sink body 24.

Figure 2:
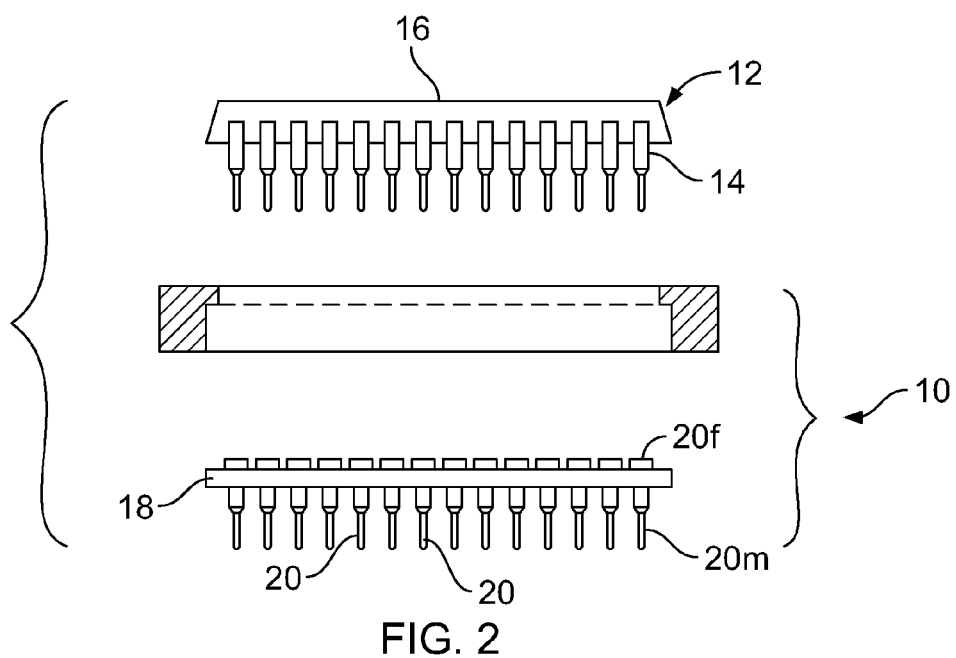
FIG. 2 is an exploded side view of the device and socket.
Figure 3:
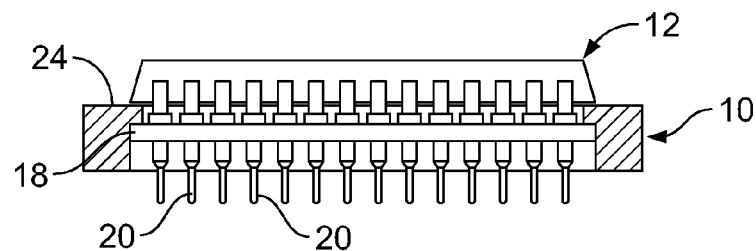
FIG. 3 is a side view thereof showing the heat sink portion in cross-section along a line 3-3 of FIG. 1.
Figure 4:
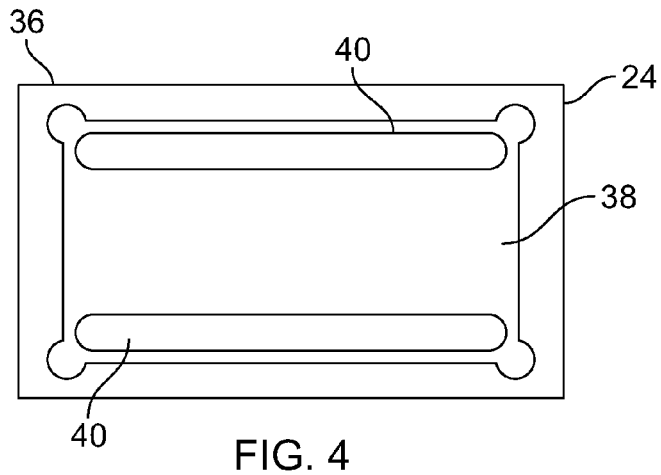
FIG. 4 is a bottom view of the heat sink.
Figure 5:
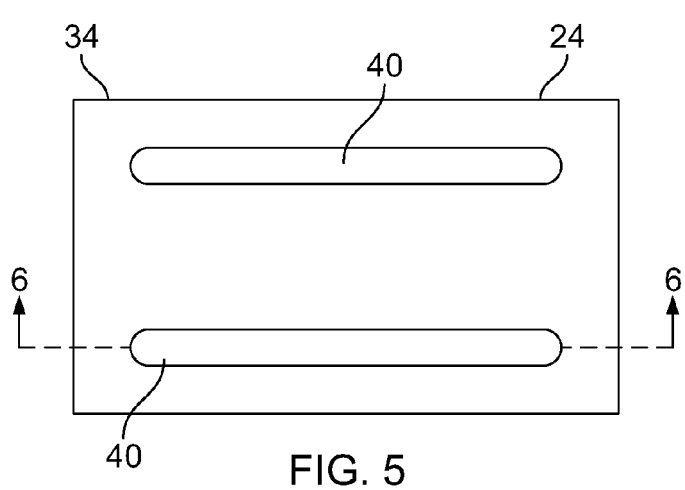
FIG. 5 is a top view of the heat sink.
Figure 6:
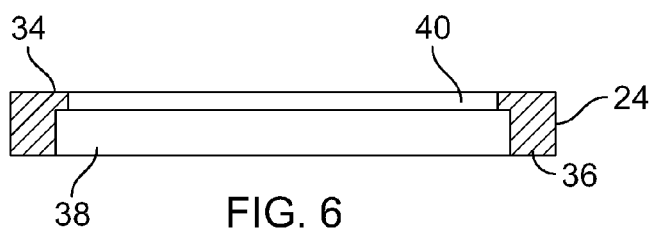
FIG. 6 is a cross-sectional view thereof taken along line 6-6 of FIG. 5.
Figure 10:
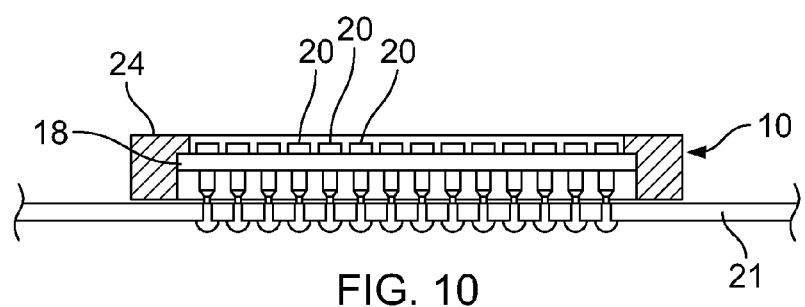
FIG. 10 is a side view thereof showing the socket mounted in a PCB.

Referring to FIG. 2, each electrical terminal 20 has a female upper end 20f which can receive the lead 14 of an electronic device 12, and a male lower end 20m which, in turn, can be received into a soldering vias in a PCB 21 (See FIG. 10). The terminal ends 20m can also be received in another socket (not shown). The terminals 20 are mounted within the circuit board 18 and are electrically insulated from each other.

Figure 7:
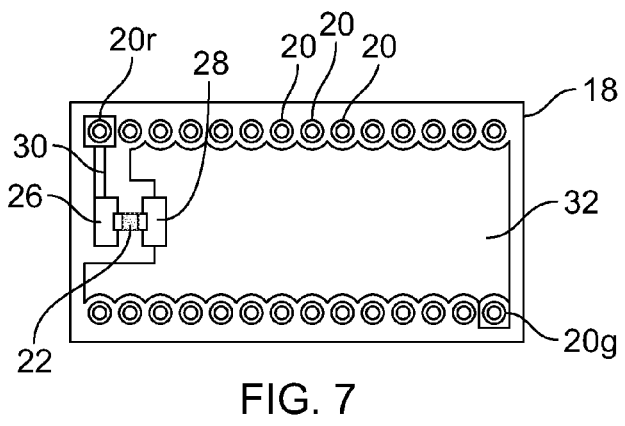
FIG. 7 is a top view of the capacitor board.

Referring to FIG. 7, the decoupling capacitor 22 is electrically connected between a predetermined pair of the electrical terminals 20v, 20g corresponding to the voltage and ground terminals of the electronic device 12. The capacitor 22 is mounted on spaced contact pads 26, 28 which are in turn connected to the respective terminals 20v, 20g by conductive traces 30, 32 extending from the respective contact pads 26, 28 to the respective terminals 20v, 20g. The use of a decoupling capacitor 22 to reduce circuit voltage noise is known in the art, and is generally disclosed in U.S. Pat. No. 4,779,164, the entire contents of which is incorporated herein by reference. Briefly, the capacitor 22 and connections provide a low impedance and low inductance decoupling loop which results in a reduced voltage noise within the integrated circuit.

The heat sink body 24 is formed from a thermally conductive material and has an upper surface 34 configured to receive an electronic device in thermally conductive relation. In this regard, the type of electronic device contemplated for use with this socket 10 would be a device that tends to generate significant amounts of heat, such as an LED, or an imaging device (such as a CCD) and that typically would include a heat spreader plate (not shown) on a rear surface thereof. The shape of the device package is not particularly critical to the function of the invention, it being noted that the present socket 10 can be adapted and modified in its shape, number of terminals, and arrangement of terminals to satisfy virtually any electronic device package.

The heat sink body 24 further has a lower surface 36 that includes a recessed cavity 38 configured to receive the circuit board 18 in interfitting mated relation. The heat sink body 24 has vias 40 corresponding to the electrical terminals 20 extending from the upper surface 34 through to the recessed cavity 38. It is noted that the vias 40 can also be adapted to the particular shape and arrangement of the leads of the device package. The vias 40 can be single vias, or larger vias which accommodate multiple leads extending therethrough. As illustrated, the vias 40 comprise elongated rectangular vias which correspond to the dual-inline array of terminals 20. In the case of circular device, the vias 40 can be arcuate The shape, size and configuration of the heat sink body 24 and use of optional heat spreader fins or pins (not shown) can also be adapted as needed to satisfy the mounting and heat dissipation needs of the particular package.

Figure 8:
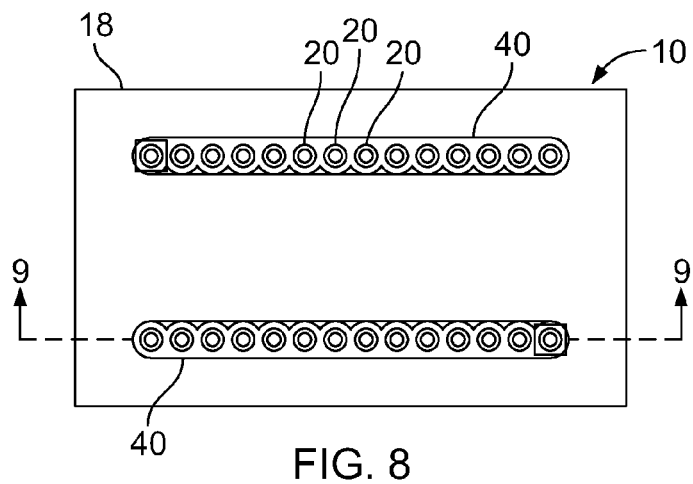
FIG. 8 is a top view showing the capacitor board installed within the heat sink body.
Figure 9:
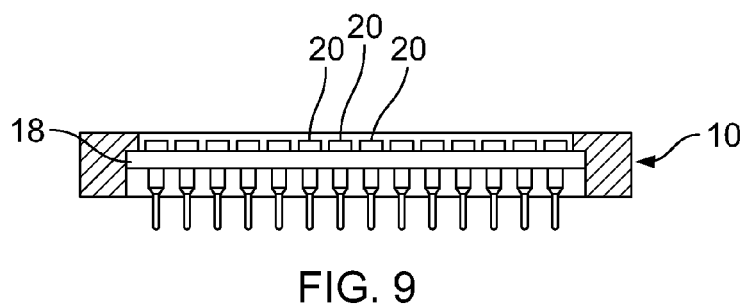
FIG. 9 is a cross-sectional view thereof taken along line 9-9 of FIG. 8.

Referring to FIGS. 2, 8 and 9, the circuit board 18 is received in mated relation within the recessed cavity 38 wherein the female upper ends 20f of said electrical terminals 20 are aligned with vias 40 and receive the leads 14 of the electronic device 12 seated on the upper surface 34 of the heat sink body 24. The male ends 20m of the electrical terminals 20 extend below the lower surface 36 of the heat sink body 24 for connection with a PCB 21 (see FIGS. 3 and 10).

Figure 11:
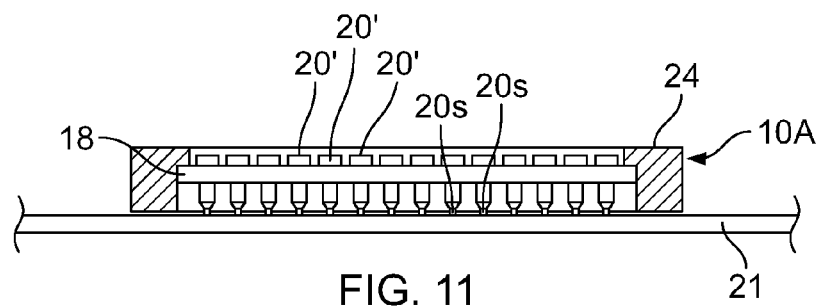
FIG. 11 is a side view of another embodiment where the terminals are shortened for surface mounting onto a PCB.

Referring now to FIG. 11 another embodiment of the socket is indicated at 10' and is configured for a surface mount application. In this embodiment, the terminals 20' have shortened lower ends 20s to allow surface mounting onto surface pads of a PCB 21.

It can therefore be seen that the present invention provides an improved electronic device socket 10 including an integrated heat sink 24 and an integrated decoupling capacitor 22. For these reasons, the instant invention is believed to represent a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An electronic device socket comprising:
an insulating circuit board having a plurality of electrical terminals mounted therein, said electrical terminals having a female upper end and a male lower end;
a decoupling capacitor mounted on said circuit board, said capacitor being electrically connected between a predetermined pair of said electrical terminals representing voltage and ground terminals; and
a heat sink body having an upper surface configured to receive an electronic device in thermally conductive relation, and a lower surface having a recessed cavity configured to receive said circuit board in interfitting mated relation, said heat sink body having at least one via extending from said upper surface to said recessed cavity,
said circuit board being received within said recessed cavity wherein said female upper ends of said electrical terminals are aligned with said at least one via for receiving the leads of an electronic device which extend through said at least one via,
said male ends of said electrical terminals extending below the lower surface of said heat sink body.

2. The electronic device socket of claim 1 wherein said plurality of electrical terminals are aligned in an array.

3. The electronic device socket of claim 1 wherein said plurality of electrical terminals are aligned in a dual-inline package (DIP) array.

4. The electronic device socket of claim 3 wherein at least one via comprises two elongated vias aligned with said electrical terminals in said DIP array.

5. The electronic socket of claim 1 wherein said male lower ends of said terminals are extended for receipt into vias of a printed circuit board.

6. The electronic socket of claim 1 wherein said male lower ends of said terminals are shortened for soldering to surface mount pads on a printed circuit board.

* * * * *